(12) United States Patent
Ueta (10) Patent No.: US 12,302,670 B2
(45) Date of Patent: May 13, 2025

(54) LIGHT-EMITTING DEVICE CONTAINING QUANTUM DOTS AND METHOD FOR MANUFACTURING SAME

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 426 days.

(21) Appl. No.: 17/781,278

(22) PCT Filed: Dec. 13, 2019

(86) PCT No.: PCT/JP2019/048873
§ 371 (c)(1),
(2) Date: May 31, 2022

(87) PCT Pub. No.: WO2021/117210
PCT Pub. Date: Jun. 17, 2021

(65) Prior Publication Data
US 2022/0416131 A1    Dec. 29, 2022

(51) Int. Cl.
*H10H 20/851*    (2025.01)
*H10H 20/01*    (2025.01)

(52) U.S. Cl.
CPC ........ *H10H 20/8514* (2025.01); *H10H 20/01* (2025.01); *H10H 20/0361* (2025.01)

(58) Field of Classification Search
CPC ............... H01L 33/505; H01L 33/005; H01L 2933/0041; H01L 33/502; H10K 50/115; H10K 59/38; H05B 33/14
See application file for complete search history.

(56) References Cited

U.S. PATENT DOCUMENTS

| 10,395,882 | B1* | 8/2019 | Moody | H01J 29/04 |
| 2012/0270231 | A1* | 10/2012 | Smith | C09K 11/02 |
|  |  |  |  | 435/7.1 |
| 2016/0211409 | A1* | 7/2016 | Kazama | C30B 7/14 |
| 2017/0355903 | A1* | 12/2017 | Kazama | C30B 29/403 |
| 2018/0208843 | A1* | 7/2018 | Chen | C30B 7/00 |

FOREIGN PATENT DOCUMENTS

| JP | 2009-013019 A |  | 1/2009 |
| JP | 2013-511157 A |  | 3/2013 |
| JP | 2014240512 A | * | 12/2014 |

* cited by examiner

*Primary Examiner* — Kyoung Lee
*Assistant Examiner* — Sophia W Kao
(74) *Attorney, Agent, or Firm* — ScienBiziP, P.C.

(57) ABSTRACT

A light-emitting device includes a light-emitting part. The light-emitting part contains a quantum dot. The quantum dot has a core and a shell. The shell is located outside the core. Each of the core and the shell has a hexagonal structure. The lattice constant of the core is larger than the lattice constant of the shell.

18 Claims, 10 Drawing Sheets

LIGHT-EMITTING DEVICE CONTAINING
QUANTUM DOTS AND METHOD FOR
MANUFACTURING SAME

TECHNICAL FIELD

The disclosure relates to a light-emitting device and a method for manufacturing the same.

BACKGROUND ART

Using a quantum dot (QD) as an emission material has been proposed recently (see Patent Literature 1 for instance).

CITATION LIST

Patent Literature

Patent Literature 1: Japanese Unexamined Patent Application Publication No. 2009-13019

SUMMARY

Technical Problem

A light-emitting device containing quantum dots is required to improve the quantum yield of the quantum dots to thus improve light-emission efficiency.

The present disclosure aims mainly to provide a light-emitting device with high light-emission efficiency.

Solution to Problem

A light-emitting device in one aspect of the disclosure includes a light-emitting part. The light-emitting part contains a quantum dot. The quantum dot has a core and a shell. The shell is located outside the core. Each of the core and the shell has a hexagonal structure. The lattice constant of the core is larger than the lattice constant of the shell.

A method for manufacturing a light-emitting device in one aspect of the present invention is a method for manufacturing a light-emitting device that includes a light-emitting part containing a quantum dot having a core and a shell located outside the core. The method in the aspect of the present invention includes a nucleus generation step, a core formation step, and a shell formation step. The nucleus generation step includes supplying the raw material of the core to a reactor to generate the nucleus of the core. The core formation step includes growing the nucleus of the core to form the core. The shell formation step includes supplying the raw material of the shell to the reactor to form the shell having a lattice constant smaller than the lattice constant of the core. The nucleus generation step is started with the reactor under pressure.

DESCRIPTION OF EMBODIMENTS

An example preferred embodiment of the disclosure will be described. The following embodiments are merely illustrative. The disclosure is not limited to the following embodiments at all.

First Embodiment

Figure 1:
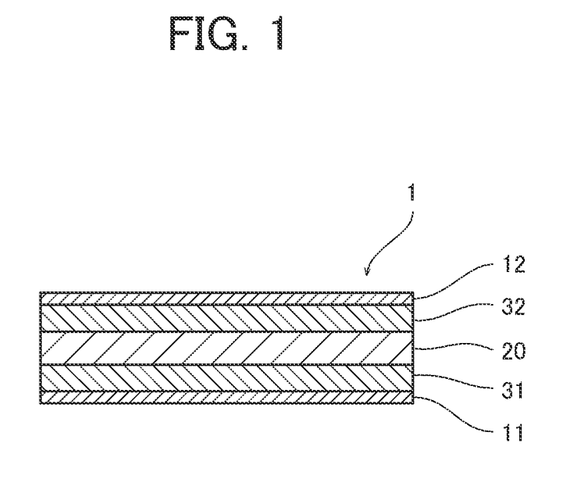
FIG. 1 is a schematic sectional view of a light-emitting device according to a first embodiment.

FIG. 1 is a schematic sectional view of a light-emitting device 1 according to a first embodiment.

As illustrated in FIG. 1, the light-emitting device 1 includes a first electrode 11, a second electrode 12, and a light-emitting layer 20, which is a light-emitting part. The light-emitting layer 20 is disposed on the first electrode 11. The second electrode 12 is disposed on the light-emitting layer 20. The light-emitting layer 20 is disposed between the first electrode 11 and the second electrode 12.

The first electrode 11 and the second electrode 12 inject electrical charge into the light-emitting layer 20. To be specific, the first electrode 11 is an electrode for injecting holes into the light-emitting layer 20. The first electrode 11 functions as an anode.

The first electrode 11 can be composed of a conductive material, such as metal or a transparent conductive oxide (TCO). The first electrode 11 may be a reflective electrode or a transparent electrode. The first electrode 11, when being a reflective electrode, can be composed of metal, such as Al, Cu, Au or Ag. The first electrode 11, when being a transparent electrode, can be composed of a thin film of metal, such as Al, Cu, Au, Ag or Ti, or can be composed of a TCO, such as an indium tin oxide (ITO), an indium zinc oxide (IZO), a zinc oxide (ZnO), an aluminum zinc oxide (ZnO:Al(AZO)), or a boron zinc oxide (ZnO:B(BZO)). The first electrode 11 can be also composed of a stack of at least one metal layer and at least one TCO layer, for instance.

How to form the first electrode 11 can be selected as appropriate, depending on the material of the first electrode 11 and other things. The first electrode 11 can be formed through, but not limited to, physical vapor deposition (PVD) or chemical vapor deposition (CVD). A specific example of PVD is sputtering.

The second electrode 12 is an electrode for injecting electrons into the light-emitting layer 20. The second electrode 12 functions as a cathode.

The second electrode 12 can be composed of a conductive material, such as metal or a TCO. The second electrode 12 is preferably a transparent electrode when the first electrode 11 is a reflective electrode. The second electrode 12 may be a reflective electrode or a transparent electrode when the first electrode 11 is a transparent electrode. The second electrode 12, when being a reflective electrode, can be composed of metal, such as Al, Ag or Mg. The second electrode 12, when being a transparent electrode, can be composed of a thin film of metal, such as Al, Cu, Au, Ag or Ti, or can be composed of a TCO, such as an indium tin oxide (ITO), an indium zinc oxide (IZO), a zinc oxide (ZnO), an aluminum zinc oxide (ZnO:Al (AZO)), or a boron zinc oxide (ZnO:B(BZO)). The second electrode 12 can be also composed of a stack of at least one metal layer and at least one TCO layer, for instance.

How to form the second electrode 12 can be selected as appropriate, depending on the material of the second electrode 12 and other things. The second electrode 12 can be formed through, but not limited to, PVD or CVD. A specific example of PVD is sputtering.

The light-emitting device 1 may be an element that takes out light emitted from the light-emitting layer 20, by way of the first electrode 11; alternatively, the light-emitting device 1 may be an element that takes out light emitted from the light-emitting layer 20, by way of the second electrode 12; alternatively, the light-emitting device 1 may be an element that takes out light emitted from the light-emitting layer 20, by way of both the first electrode 11 and the second electrode 12.

The light-emitting device 1 in this embodiment further includes a base member (not shown), such as a substrate, that is provided for supporting and holding the light-emitting device 1.

Figure 2:
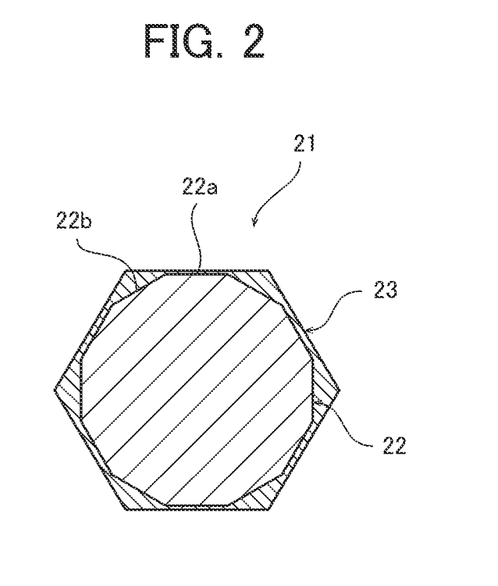
FIG. 2 is an image diagram of a quantum dot.

The light-emitting layer 20 contains quantum dots 21 (see FIG. 2). The light-emitting layer 20 may contain one kind of quantum dots 21 or a plurality of kinds of quantum dots 21, for instance. The light-emitting layer 20 may contain, for instance, a plurality of kinds of quantum dots 21 having the substantially same composition and having respective particle diameters different from each other. The light-emitting layer 20 may contain, for instance, a plurality of kinds of quantum dots 21 having respective compositions different from each other and having the substantially same particle diameter. The light-emitting layer 20 may contain, for instance, a plurality of kinds of quantum dots 21 having respective compositions different from each other and having respective particle diameters different from each other.

A "quantum dot" herein refers to a semiconductor crystal that shows a quantum size effect.

The quantum dots 21 may be composed of a semiconductor crystal (semiconductor nanocrystal for instance) having a particle diameter equal to or smaller than 100 nm, preferably a particle diameter equal to or smaller than 50 nm, further preferably a particle diameter equal to or smaller than 30 nm. The light-emission peak wavelength of the quantum dots 21 depends of the particle diameter of the quantum dots 21. To be specific, the larger the particle diameter of the quantum dots 21 is, the longer the light-emission peak wavelength of the quantum dots 21 tends to be. The smaller the particle diameter of the quantum dots 21 is, the shorter the light-emission peak wavelength of the quantum dots 21 tends to be.

Each quantum dot 21 has a "core-shell structure", as illustrated in FIG. 2. To be specific, each quantum dot 21 has a core 22 and a shell 23. The shell 23 is located outside the core 22. The shell 23 covers at least part of the outer surface of the core 22. The shell 23 substantially covers the entire outer surface of the core 22. However, the shell 23 usually has a deficit, and the outer surface of the core 22 is hence partly exposed in some cases.

The number of layers of the shell 23, disposed outside the core 22, is non-limiting. The core 22 may be covered with a stack of a plurality of shells 23 for instance.

The quantum dot 21 may further have a ligand coordinating with the shell 23. Specific examples of the ligand include, but not limited to, a thiol compound and an amine compound.

The core 22 and the shell 23 each can be composed of an appropriate semiconductor. The core 22 and the shell 23 can be composed of the same semiconductor or semiconductors different from each other. The core 22 and the shell 23 are each preferably composed of such a semiconductor that the coefficient of thermal expansion of the shell 23 is larger than the coefficient of thermal expansion of the core 22.

The core 22 and the shell 23 each preferably contain at least one of a group II-VI semiconductor and a group III-V semiconductor and are each preferably composed of at least one of a group II-VI semiconductor and a group III-V semiconductor, for instance.

The group II-VI semiconductor herein is a semiconductor containing at least one group II element (a second-group element and a twelfth-group element) and at least one group VI element (a sixteenth-group element). The group II-VI semiconductor may be a semiconductor consisting of a group II element and a group VI element.

Examples of the group II element constituting the group II-VI semiconductor include, but not limited to, Mg, Zn, Cd, and Hg. Examples of the group VI element constituting the group II-VI semiconductor include, but not limited to, O, S, Se, and Te.

Specific examples of the group II-VI semiconductor include, but not limited to, ZnSe, ZnS, CdSe, CdS, ZnTeSe, and ZnTeS. In these semiconductors, the stoichiometric ratio between the group II element and the group VI element is not limited to 1:1. In the group II-VI semiconductor, the group VI elements are preferably fewer than the group II elements in their stoichiometric ratio. In the group II-VI semiconductor, the stoichiometric ratio between the group II element and the group VI element (group VI element/group II element) is preferably equal to or smaller than 0.9 and is more desirably 0.5.

The group III-V semiconductor is a semiconductor containing at least one group III element and at least one group V element. The group III-V semiconductor may be a semiconductor consisting of a group III element and a group V element.

Examples of the group III element constituting the group III-V semiconductor include, but not limited to, Al, Ga, and In. Examples of the group V element constituting the group III-V semiconductor include, but not limited to, N, P, As, and Sb.

Specific examples of the group III-V semiconductor include, but not limited to, GaN, AlN, InN, and InP. In these semiconductors, the stoichiometric ratio between the group III element and the group V element is not limited to 1:1. In the group III-V semiconductor, the group III elements are preferably fewer than the group V elements in their stoichiometric ratio. In the group III-V semiconductor, the stoichiometric ratio between the group III element and the group V element (group V element/group III element) is preferably equal to or smaller than 0.9 and is more desirably 0.5.

Specific examples of a preferable combination of the core 22 and shell 23 (core 22-shell 23) include, but not limited to, CdSe—ZnS, CdSe—ZnSe, InP—ZnS, InP—ZnSe, CdTe—

ZnS, CdTe—ZnSe, CdTe—In$_2$O$_3$, CdTe—Ga$_2$O$_3$, ZnTe—ZnS, ZnTe—ZnSe, ZnTe—In$_2$O$_3$, ZnTe—Ga$_2$O$_3$, ZnSeTe—ZnS, ZnSeTe—In$_2$O$_3$, ZnSeTe—Ga$_2$O$_3$, InP—In$_2$O$_3$, InP—Ga$_2$O$_3$, InN—GaN, InN—In$_2$O$_3$, InN—Ga$_2$O$_3$, InNP—GaN, InNP—AlN, InNP—ZnS, InNP—In$_2$O$_3$, InNP—Ga$_2$O$_3$, InNAs—GaN, InNAs—AlN, InNAs—ZnS, InNAs—In$_2$O$_3$, and InNAs/Ga$_2$O$_3$.

The composition of the core 22 and shell 23 (elements constituting the core 22 and the shell 23) can be identified by energy dispersive x-ray spectroscopy (EDX) analysis using a transmission electron microscope (TEM) and by element mapping.

Each of the core 22 and the shell 23 has a hexagonal structure.

The wording "each of the core 22 and the shell 23 has a hexagonal structure" herein means that two diffraction patterns of a six-fold symmetry are observed when the light-emitting layer 20 containing the quantum dots 21 undergoes X-ray diffraction (XRD) measurement: one is the diffraction pattern of a six-fold symmetry deriving from the core 22, and the other is the diffraction pattern of a six-fold symmetry deriving from the shell 23. It is noted that the XRD measurement is preferably preformed through in-plane diffraction, where an incident X-ray and a diffraction X-ray are almost parallel on a sample surface.

The lattice constant of the core 22 is larger than the lattice constant of the shell 23. The lattice constant of the core 22 is preferably larger than the lattice constant of the shell 23 by 1.05 times or greater and two times or smaller, and more desirably by 1.2 times or greater and 1.5 times or smaller.

The lattice constants of the respective core 22 and shell 23 can be calculated from diffraction patterns corresponding to the respective core 22 and shell 23 and observed when the light-emitting layer 20 containing the quantum dots 21 undergo XRD measurement.

At least one charging layer may be disposed between at least one of the first electrode 11 and second electrode 12, and the light-emitting layer 20. The charging layer may be, for instance, a charge transport layer that transports electrical charge, such as holes and electrons, or a charge injection layer that injects electrical charge.

To be specific, the light-emitting device 1 in this embodiment further includes a first charging layer 31 and a second charging layer 32, as illustrated in FIG. 1.

The first charging layer 31 is disposed between the first electrode 11 and the light-emitting layer 20. The first charging layer 31 is electrically connected to each of the first electrode 11 and the light-emitting layer 20. The first charging layer 31 functions as a hole transport layer. The first charging layer 31 transports holes injected from the first electrode 11, to the light-emitting layer 20. Thus in this embodiment, holes from the first electrode 11 are injected into the first charging layer 31 and are then transported to the light-emitting layer 20.

The first charging layer 31 may have the function of electron blockage, where electrons are prevented from being transported to the first electrode 11.

The first charging layer 31 contains a hole transport material. Specific examples of the hole transport material include, but not limited to, NiO, Cr$_2$O$_3$, MgO, LaNiO$_3$, MoO$_3$, and WO$_3$.

The second charging layer 32 is disposed between the second electrode 12 and the light-emitting layer 20. The second charging layer 32 is electrically connected to each of the second electrode 12 and the light-emitting layer 20. The second charging layer 32 functions as an electron transport layer. The second charging layer 32 transports electrons injected from the second electrode 12, to the light-emitting layer 20. Thus in this embodiment, electrons from the second electrode 12 are injected into the second charging layer 32 and are then transported to the light-emitting layer 20.

The second charging layer 32 may have the function of hole blockage, where holes are prevented from being transported to the second electrode 12.

The second charging layer 32 contains an electron transport material. Specific examples of the electron transport material include, but not limited to, TiO$_2$, ZnO, AZO, IZO, ZnMgO, ITO.

In the light-emitting device 1, holes and electrons are injected into the quantum dots 21 within the light-emitting layer 20 upon voltage application between the first electrode 11 and the second electrode 12. The electrons position in the conduction band and the holes positioned in the valence band rejoin within the quantum dots 21. This electron-hole rejoining causes light of a wavelength that corresponds to the energy gap between the conduction band, where the electrons are positioned, and the valence band, where the holes are positioned, to exit from the quantum dots 21.

Each of the core 22 and shell 23 in the light-emitting device 1 has a hexagonal structure, and the lattice constant of the core 22 is larger than the lattice constant of the shell 23, as described above. The quantum dot 21 hence has high light-emission quantum yield. The light-emitting device 1 thus has high light-emission efficiency. The following is a possible reason for why this effect is achieved.

Figure 3:
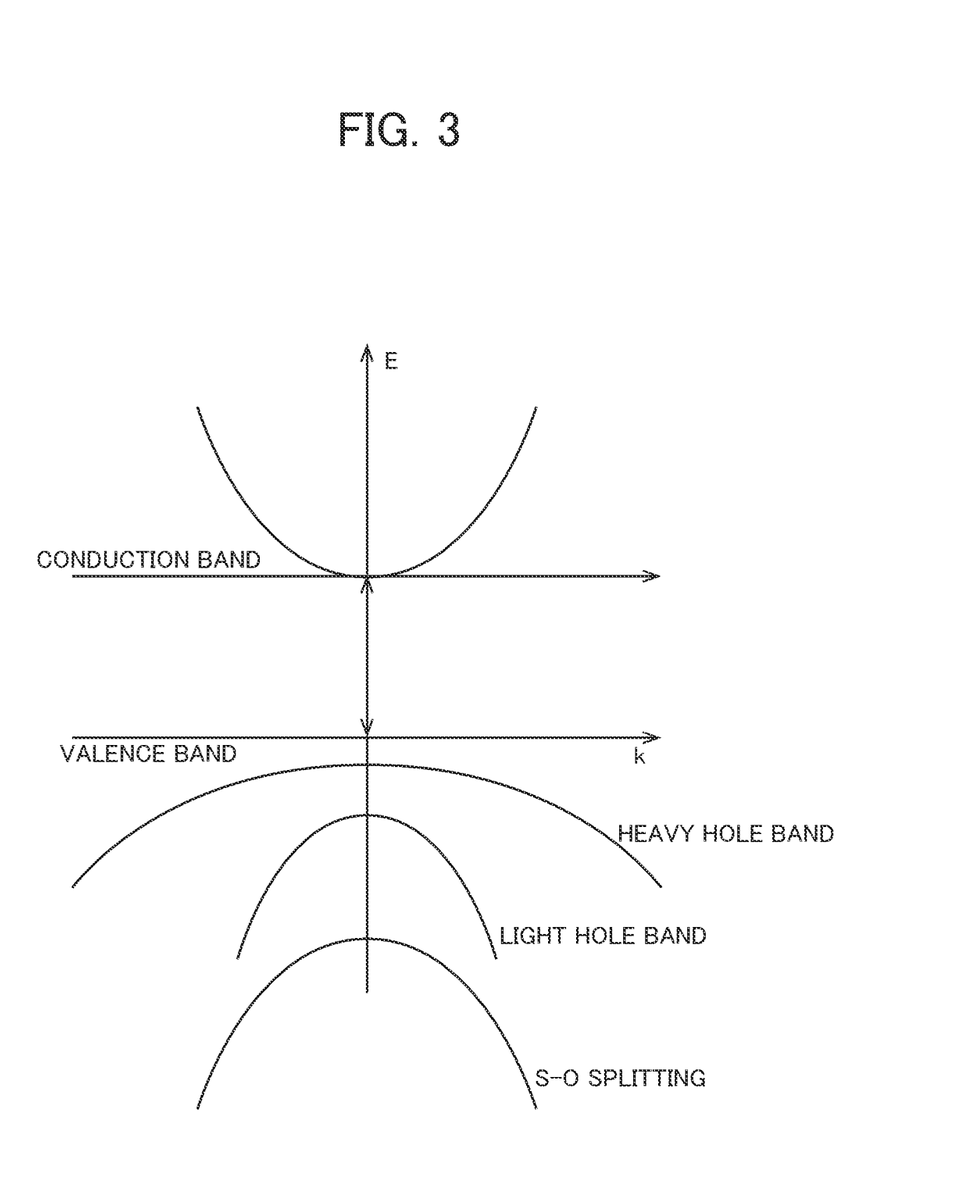
FIG. 3 is a model diagram (strain-free state) showing each band of a quantum dot having a hexagonal-structure core.

FIG. 3 is a model diagram showing each band of a quantum dot having a hexagonal-structure core. The model diagram shown in FIG. 3 is a diagram on the assumption that no strain is occurring in the core. The model diagram shown in FIG. 3, illustrating each band of the quantum dot, is illustrated in the form of an E-k plot. The S—O splitting indicates an SO-splitting hole band.

In a quantum dot having a hexagonal-structure core, the heavy hole band has a higher energy level than the light hole band, as illustrated in FIG. 3. The energy gap between the conduction band and the heavy hole band is hence smaller than the energy gap between the conduction band and the light hole band. Light emission resulting from the rejoining of holes and electrons positioned in the heavy hole band is thus superior. A quantum dot having a hexagonal-structure core resulting from the rejoining of holes and electrons located in the heavy hole band accordingly has a long light-emission rejoining lifetime under the assumption that no strain is occurring in the core.

Figure 4:
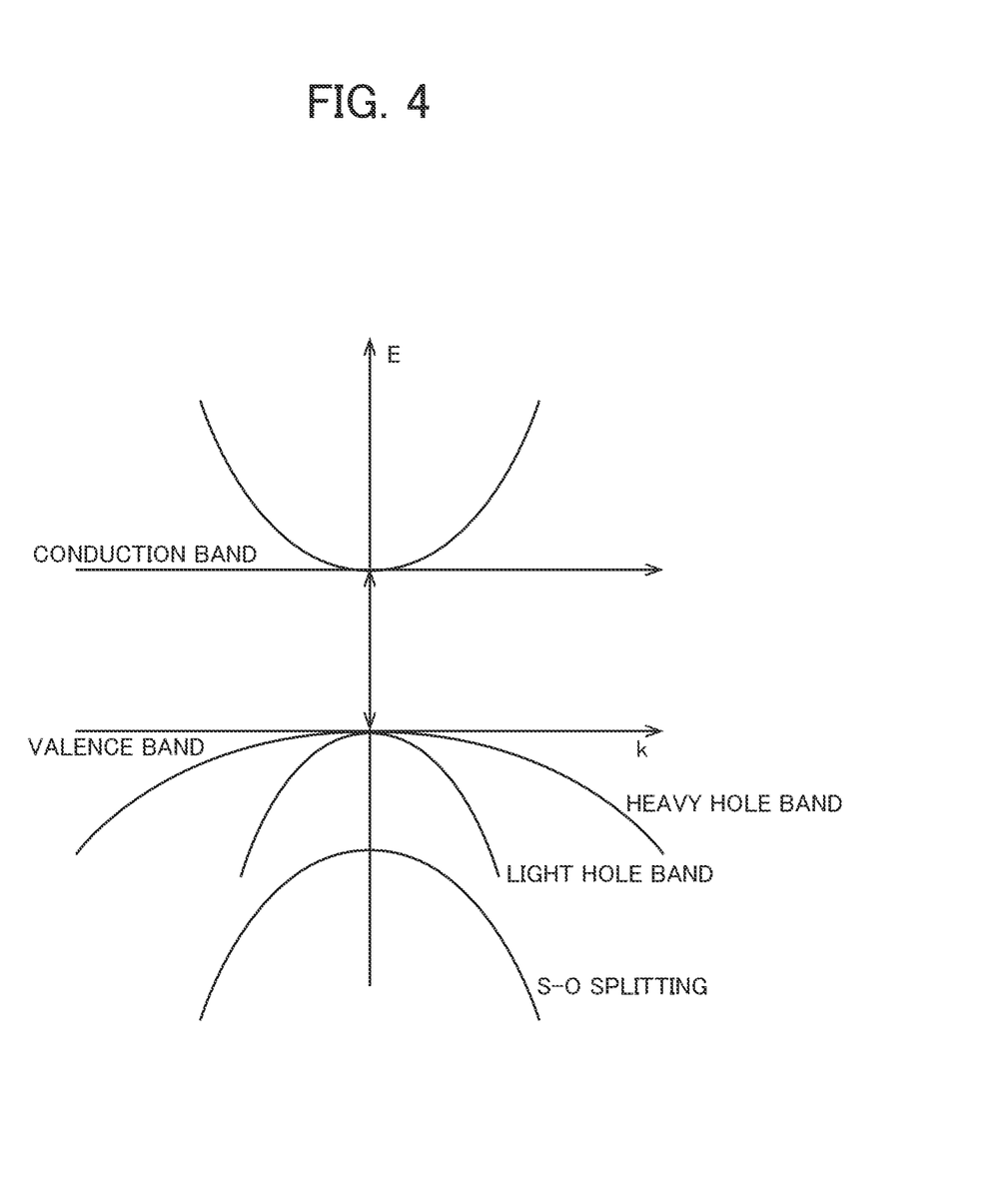
FIG. 4 is a model diagram (strain-free state) showing each band of a quantum dot having a cubic-structure core.

FIG. 4 is a model diagram showing each band of a quantum dot having a cubic-structure core. The model diagram shown in FIG. 4 is a diagram on the assumption that no strain is occurring in the core.

In a quantum dot having a cubic-structure core, the energy gap between the conduction band and the light hole band and the energy gap between the conduction band and the heavy hole band are not significantly different, as illustrated in FIG. 4. There is hence no significant difference in the ratio of contribution to light emission between holes located in the heavy hole band and holes located in the light hole band. A quantum dot having a cubic-structure core accordingly has a shorter light-emission rejoining lifetime than a quantum dot having a hexagonal core under the assumption that no strain is occurring in the core.

The ratio of non-light-emission rejoining of holes and electrons commonly increases along with increase in light-emission rejoining lifetime. The quantum yield of light emission of a quantum dot thus tends to decrease along with increase in light-emission rejoining lifetime. It thus seems that a quantum dot having a hexagonal-structure core has lower quantum yield of light emission than a quantum dot having a cubic-structure core under the assumption that no strain is occurring in the core.

Figure 5:
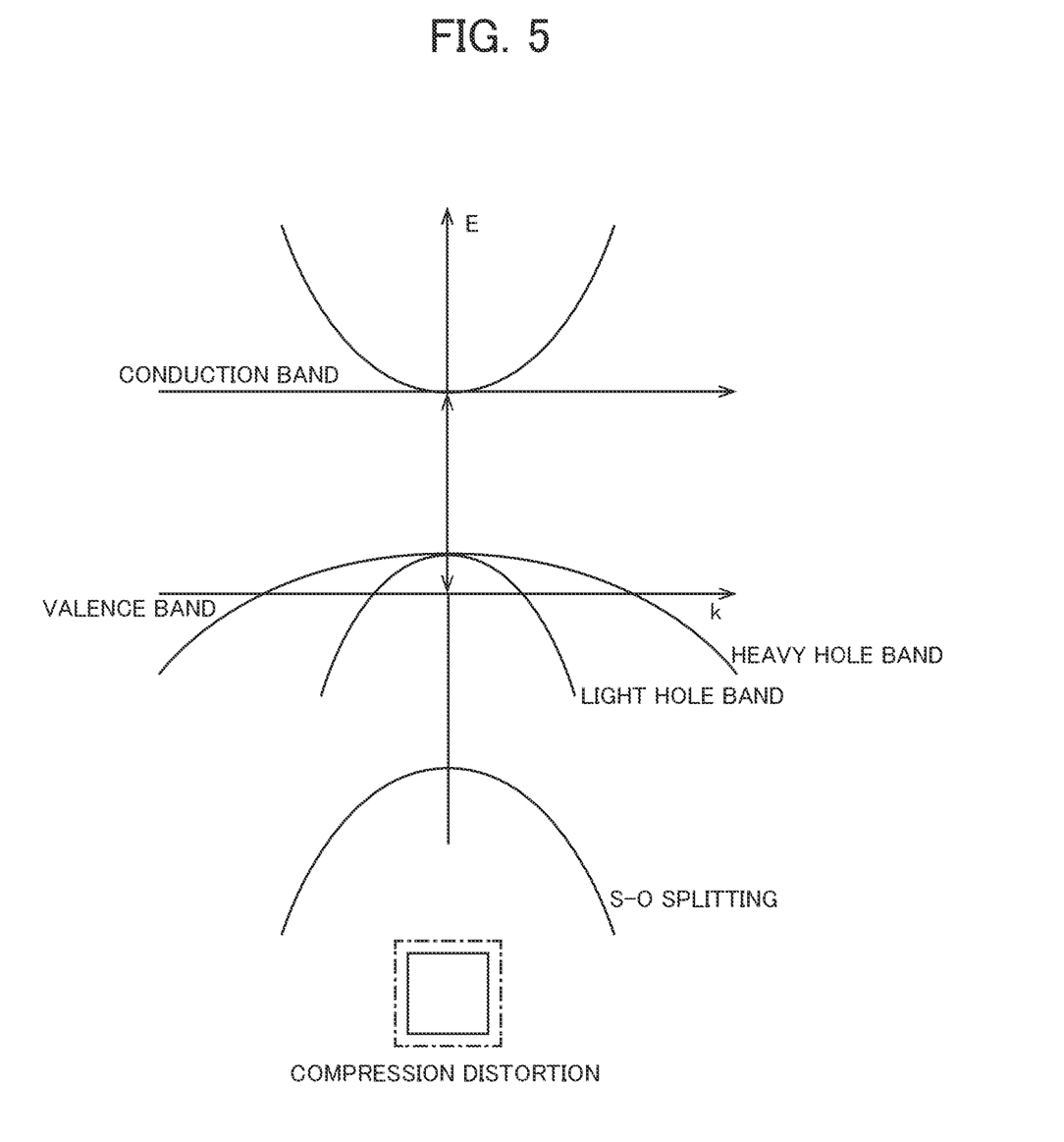
FIG. 5 is a model diagram showing each band of a quantum dot having a cubic-structure core applied with a compression strain.
Figure 6:
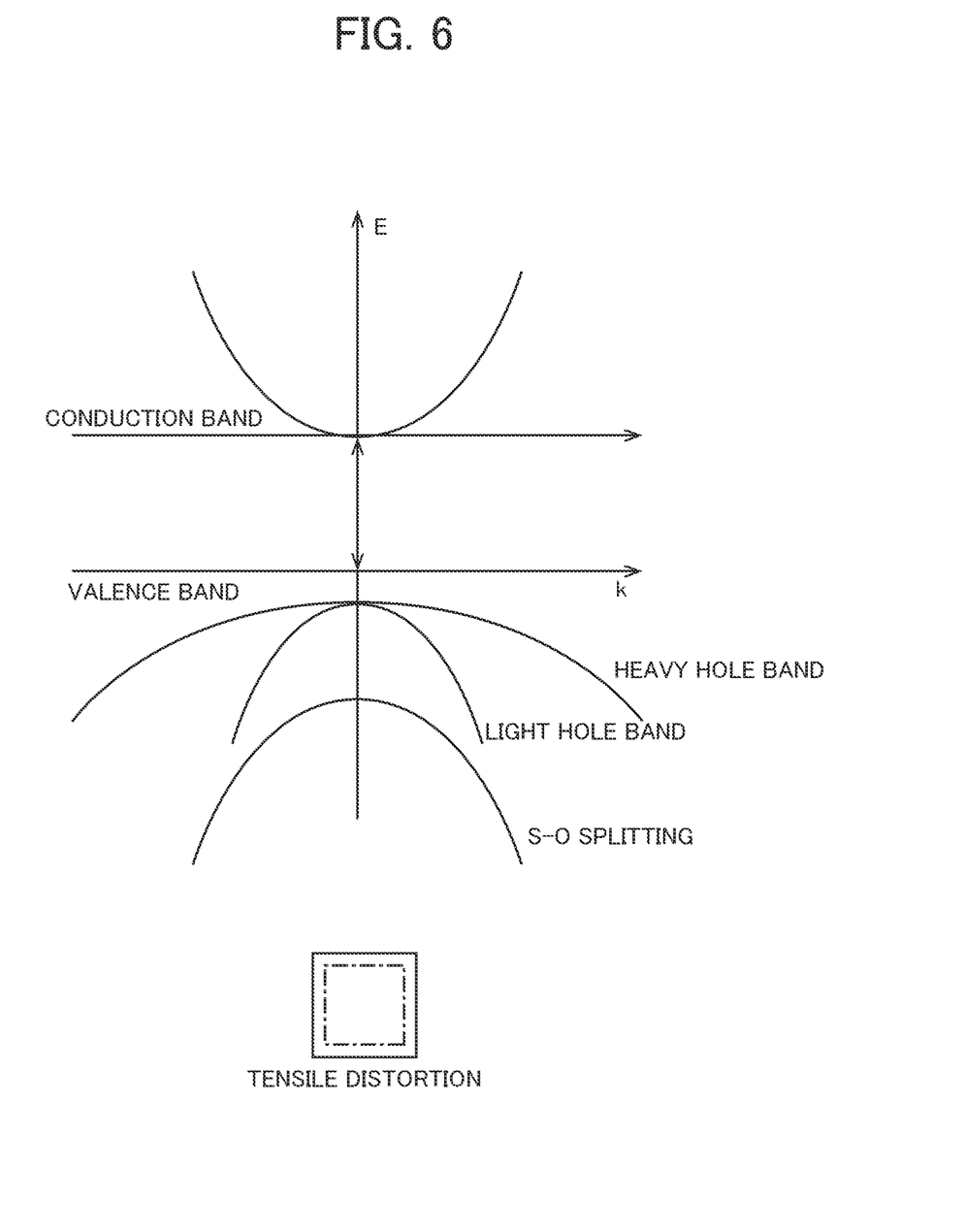
FIG. 6 is a model diagram showing each band of a quantum dot having a cubic-structure core applied with a tensile strain.

FIG. 5 is a model diagram showing each band of a quantum dot having a cubic-structure core applied with a compression strain. FIG. 6 is a model diagram showing each band of a quantum dot having a cubic-structure core applied with a tensile strain.

In a quantum dot having a cubic-structure core, the growth speed of its shell is less likely to differ in respective orientations even when a strain, such as a compression strain or a tensile strain, is applied to the core, because a cubic structure has higher symmetry than a hexagonal structure; hence, the light hole band and the heavy hole band shift substantially similarly. The ratio of contribution to light emission between holes located in the heavy hole band and holes located in the light hole band is little changed by a strain that is applied. It is thus difficult to shorten the light-emission rejoining lifetime in a quantum dot having a cubic-structure core even when a strain is applied to the core.

Figure 7:
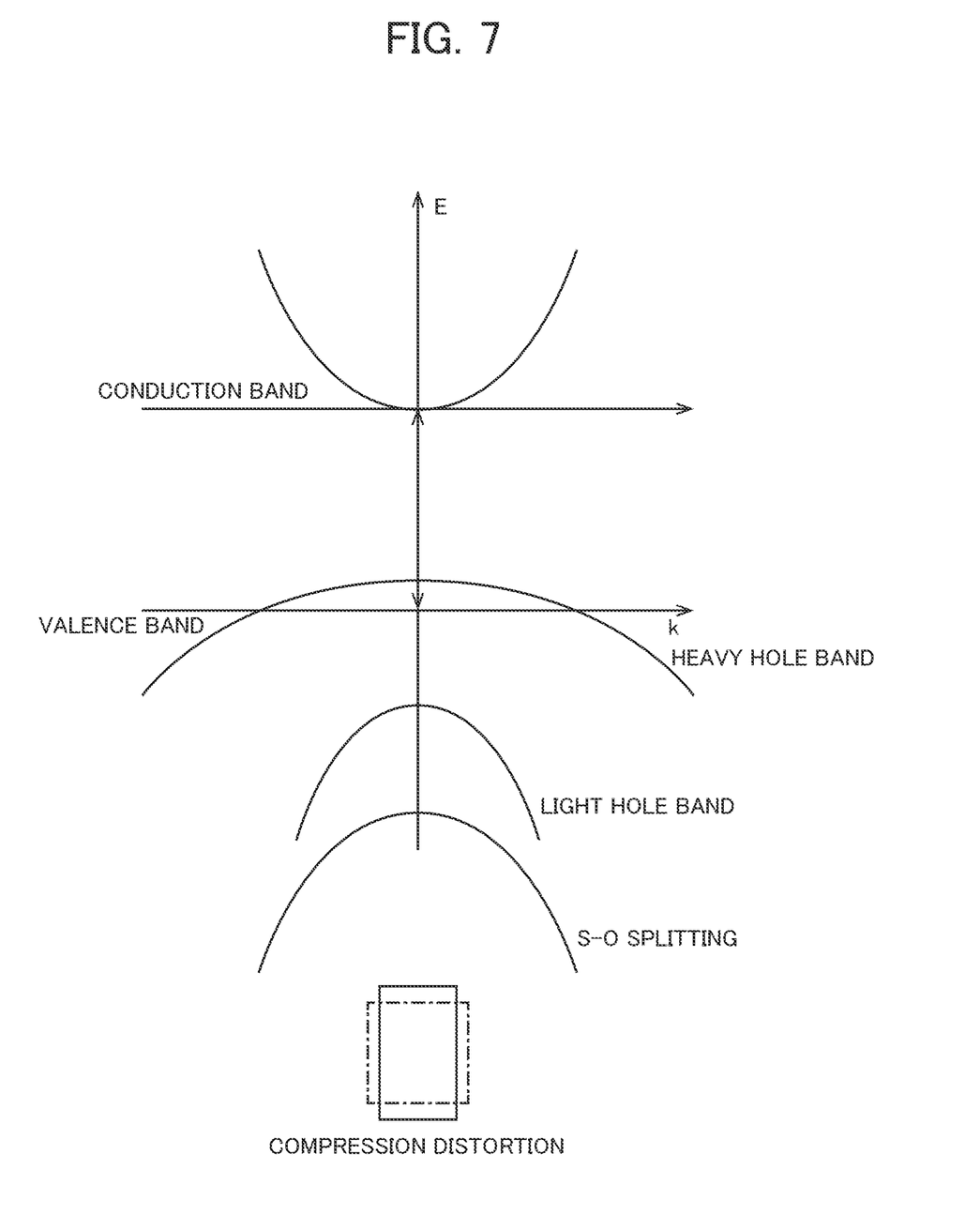
FIG. 7 is a model diagram showing each band of a quantum dot having a hexagonal-structure core applied with a compression strain.
Figure 8:
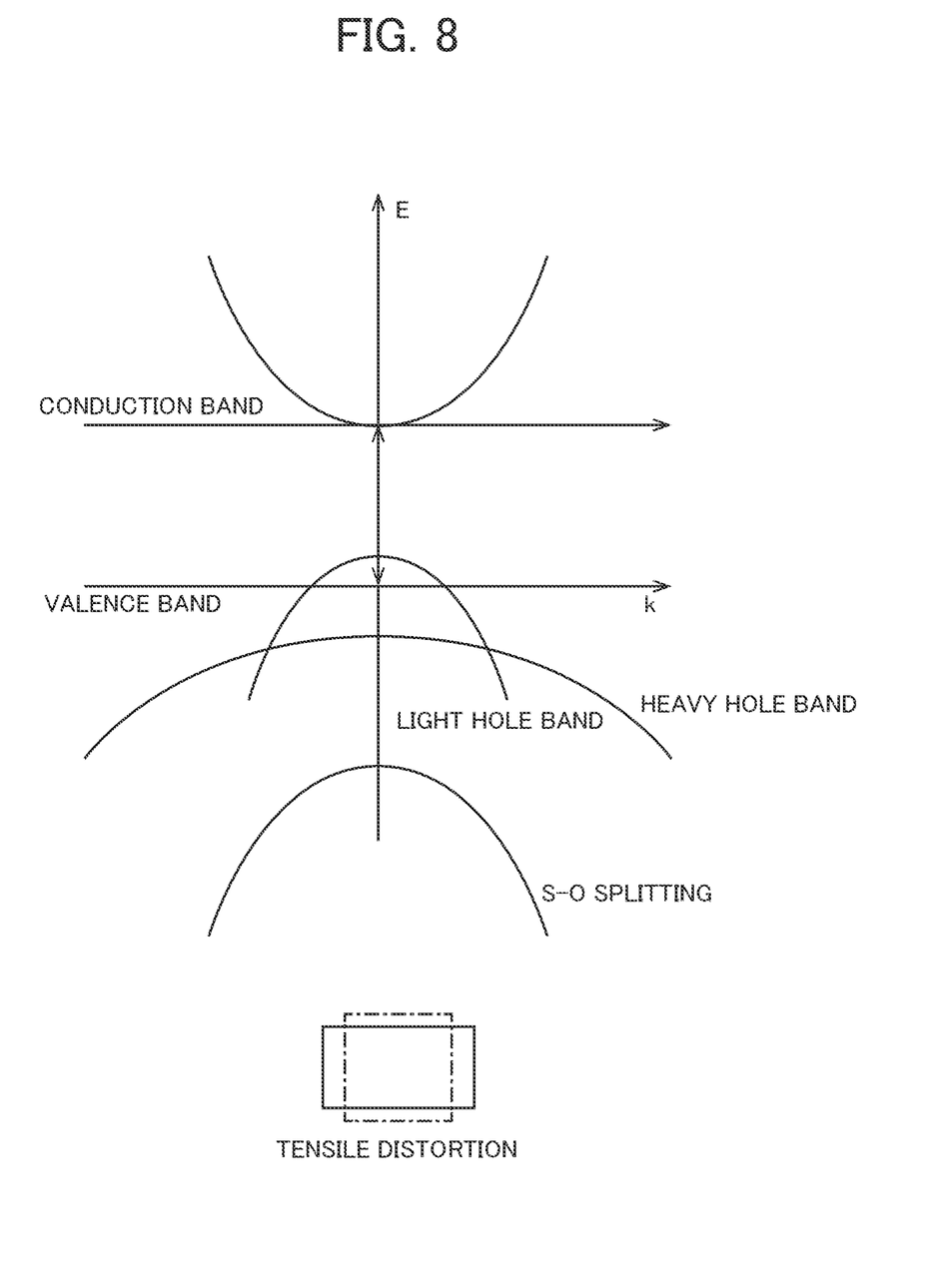
FIG. 8 is a model diagram showing each band of a quantum dot having a hexagonal-structure core applied with a tensile strain.

FIG. 7 is a model diagram showing each band of a quantum dot having a hexagonal-structure core applied with a compression strain. FIG. 8 is a model diagram showing each band of a quantum dot having a hexagonal-structure core applied with a tensile strain.

A hexagonal structure has lower symmetry than a cubic structure. Thus, in a quantum dot having a hexagonal-structure core, applying a strain to the core causes shell-growth speed in a (1-100) orientation and a (10-10) orientation, thereby changing the relative position of the light hole band and the heavy hole band considerably.

As illustrated in FIG. 7, when the core receives a compression strain to thus expand in its axial direction, the heavy hole band shifts toward the low-energy side to a greater degree than the light hole band. Application of a compression strain thus prolongs the light-emission rejoining lifetime.

As illustrated in FIG. 8, when the core receives a tensile strain to thus shrink in its axial direction and expand in a direction orthogonal to the axis, the degeneracy of the valence band is released, and the light hole band shifts to the low-energy side greatly. This considerably improves the ratio of contribution to light emission in holes located in the light hole band. The light-emission rejoining lifetime is consequently shortened considerably.

The light-emitting device 1, in which each of the core 22 and the shell 23 has a hexagonal structure, and in which the lattice constant of the core 22 is larger than the lattice constant of the shell 23, seems to be able to achieve high light-emission quantum yield and high light-emission efficiency, as described above.

To achieve higher light-emission quantum yield and higher light-emission efficiency, a tensile strain that is applied to the core 22 is preferably large. From this view point, the core 22 preferably has a plurality of crystal planes different from each other in surface free energy. The shells 23 disposed on crystal planes different from each other in surface free energy have mutually different thicknesses when each shell 23 is formed through crystal growth on the core 22. To be specific, a shell 23 is formed thickly on a crystal plane of high surface free energy, and another shell 23 is formed thinly on a crystal plane of low surface free energy. As illustrated in FIG. 2 for instance, the shell 23 disposed on a second crystal plane 22b having higher surface free energy than a first crystal plane 22a of the core 22 is thicker than the shell 23 disposed on the first crystal plane 22a. A tensile strain that occurs in the core 22 due to the shell 23 can be thus increased further. This can achieve high light-emission quantum yield and high light-emission efficiency.

The first crystal plane 22a, having relatively low surface free energy, is preferably at least one of, for instance, a (0-110) plane, a (1-100) plane, a (10-10) plane, a (01-10) plane, a (-1100) plane, and a (-1010) plane.

The second crystal plane 22b, having relatively high surface free energy, is preferably at least one of, for instance, a (2-1-10) plane, a (1-210) plane, a (11-20) plane, a (-2110) plane, a (-12-10) plane, and a (-1-120) plane.

The core 22 preferably has a crystal plane having higher surface free energy than a crystal plane of the shell 23, in order to further increase a tensile strain, which occurs in the core 22 due to the shell 23, to thus further improve light-emission quantum yield and light-emission efficiency. For instance, the ratio of an unstable plane, such as a (2-1-10) plane, a (1-210) plane, a (11-20) plane, a (-2110) plane, a (12-10) plane, or a (-1-120) plane, to a crystal plane of the core 22 (the area of the unstable plane of the core 22/the total area of the crystal plane of the core 22) is preferably higher than the ratio of an unstable plane, such as a (2-1-10) plane, a (1-210) plane, a (11-20) plane, a (-2110) plane, a (-12-10) plane, and a (1-120) plane, to a crystal plane of the shell 23 (the area of the unstable plane of the shell 23/the total area of the crystal plane of the shell 23). It is more desirable that the shell 23 do not have a relatively unstable crystal plane, and that the outline of the quantum dot 21 be in the form of a hexagonal prism.

It is noted that the crystal planes of the core 22 and shell 23 can be detected by analyzing the light-emitting layer 20 containing the quantum dots 21 through XRD analysis. It is also noted that the outline of the quantum dots 21 can be identified by visually checking the outline of the quantum dots 21 by the use of a predetermined sectional image of the light-emitting layer 20 taken by a scanning electron microscope (SEM).

In the quantum dot 21 having a hexagonal-prism shaped outline, a portion corresponding to the ridge line of adjacent planes constituting the hexagonal prism and to their vertexes may be a curved surface. The quantum dot 21 having a hexagonal-prism shaped outline may have a hexagonal-prism shape basically, with asperities on its planes.

In an image taken by a SEM, that the quantum dot 21 having a hexagonal-prism shaped outline is contained in the light-emitting layer 20 can be identified by visually checking the quantum dot 21 having a hexagonal-prism shape in section, and by observing, through XRD measurement, individual six diffraction patterns derived from the core 22 and the shell 23.

Let the core 22 contain at least one of a group II-VI semiconductor and a group III-V semiconductor for instance. Accordingly, the group VI elements are preferably fewer than the group II elements in their stoichiometric ratio in the group II-VI semiconductor; and the group V elements are preferably fewer than the group III elements in their stoichiometric ratio in the group III-V semiconductor. This configuration can increase the area ratio of an unstable plane to a crystal plane of the core 22. Thickness unevenness in the shell 23 can be hence increased. A tensile strain that occurs in the core 22 due to the shell 23 can be thus increased further. This can further improve the light-emission quantum yield and light-emission efficiency of the quantum dot 21.

To further improve the light-emission quantum yield and light-emission efficiency of the quantum dot 21, the stoichiometric ratio between the group II element and the group VI element (group VI element/group II element) in the group II-VI semiconductor contained in the core 22 is preferably equal to or smaller than 0.9 and is more desirably 0.5. The stoichiometric ratio between the group III element and the group V element (group V element/group III element) in the group III-V semiconductor contained in the core 22 is preferably equal to or smaller than 0.9 and is more desirably 0.5.

Method for Manufacturing Light-Emitting device 1

How to manufacture the light-emitting device 1 is non-limiting. The light-emitting device 1 can be manufactured by the following method for instance.

The first process step is preparing a thin-film transistor (TFT) substrate for instance. The TFT substrate can be produced through a publicly known method for instance.

The next is forming the first electrode 11 onto the TFT substrate. Forming the first electrode 11 can use, but not limited to, PVD or CVD.

The next is forming the first charging layer 31 onto the first electrode 11. The first charging layer 31 can be formed by, for instance, applying a solution with poly(3,4-ethylenedioxythiophene):poly(styrenesulfonic acid) (PEDOT:PSS) dispersed onto the first electrode 11, followed by drying and curing the first electrode 11.

The next is forming the light-emitting layer 20 onto the first charging layer 31. The light-emitting layer 20 can be formed by, for instance, applying a colloidal solution containing quantum dots onto the first charging layer 31, followed by drying the first charging layer 31. An example method of producing the quantum dots will be described later on.

The next is forming the second charging layer 32 onto the light-emitting layer 20. The second charging layer 32 can be formed by, for instance, a solution containing an electron transport material, such as $TiO_2$, ZnO, AZO, IZO, ZnMgO, or ITO, onto the light-emitting layer 20, followed by drying and curing the light-emitting layer 20.

The next is forming the second electrode 12 onto the second charging layer 32. Forming the second electrode 12 can use, but not limited to, PVD or CVD.

Method of Producing Quantum Dots 21

The following describes an example method of producing the quantum dots 21.

The quantum dots 21 each can be produced through the following process steps.

The first step is supplying the raw material of the core 22 to a reactor to generate the nucleus of the core 22 (this process step is a nucleus generation step).

The next is growing the nucleus of the core 22 to form the core 22 (this process step is a core formation step).

The next is supplying the raw material of the shell 23 to the reactor to form the shell 23 having a lattice constant smaller than the lattice constant of the core 22 (this process step is a shell formation step).

In some embodiments, the nucleus generation step, the core formation step, and the shell formation step may be independent of each other or coincide with each other. For instance, there may be a period during which the nucleus generation step and the core formation step are performed parallel (that is, a period for generating the nucleus of the core 22 as well as growing the nucleus to form the core 22).

The nucleus generation step is preferably started with the reactor under pressure, in order to form the core 22 and the shell 23 each having a hexagonal structure. In other words, it is preferable to pressurize the reactor before generating the nucleus of the core 22. Generating the nucleus of the core 22 under a pressurized atmosphere allows atoms to easily take a closest packing arrangement. This can generate a nucleus having a hexagonal structure. The crystalline structure of the nucleus is reflected on a growing crystal after the nucleus of a hexagonal structure is generated. To start generating the nucleus of the core 22 under a pressurized atmosphere is thus important to produce the quantum dot 21 having the core 22 and the shell 23 each having a hexagonal structure.

The core formation step is preferably started with the reactor under pressure (under a pressurized atmosphere), in order to form the core 22 having a hexagonal structure. The nucleus generation step and the core formation step are preferably performed with the reactor under pressure (under a pressurized atmosphere).

The nucleus generation step, the core formation step, and the shell formation step are preferably performed with the reactor under pressure (under a pressurized atmosphere), in order to form the shell 23 having a hexagonal structure.

The reactor is preferably pressurized until its inner pressure exceeds atmospheric pressure and is more desirably pressurized until the inner pressure stands at 10 MPa or higher. The reactor is preferably pressurized within a range of 100 MPa or lower in order not to spend undesirably a long time for producing the quantum dot 21, and in order to lower a pressure-resistance characteristic required for the reactor.

Figure 9:
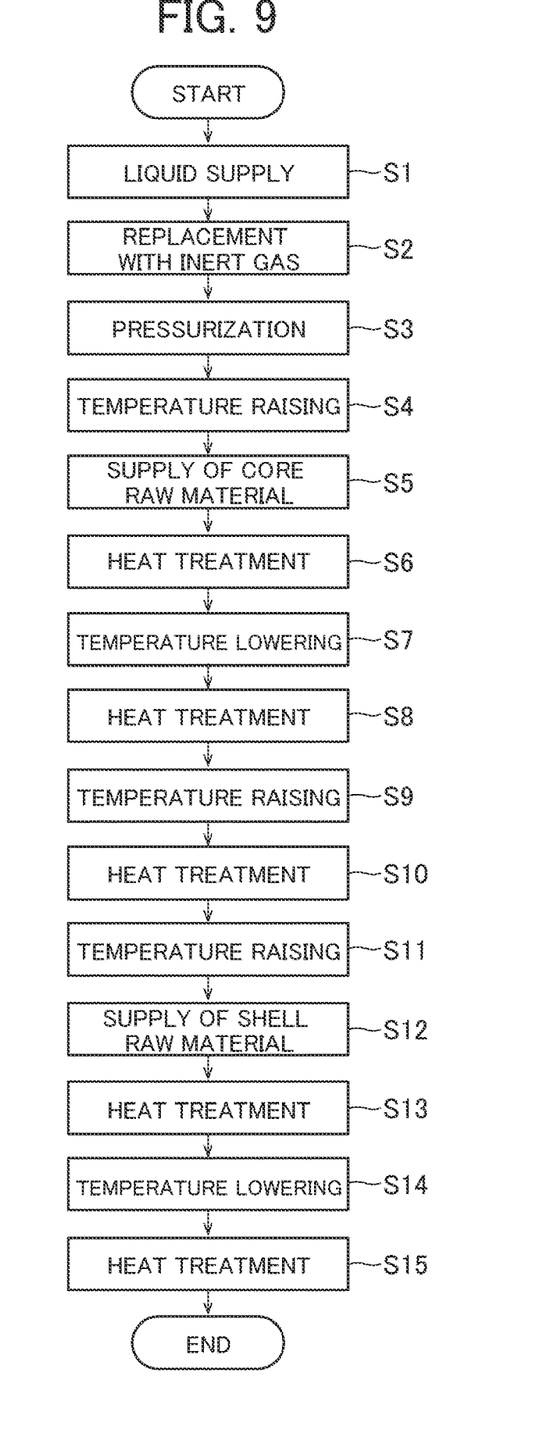
FIG. 9 is a flowchart showing process steps for producing a quantum dot in the first embodiment.
Figure 10:
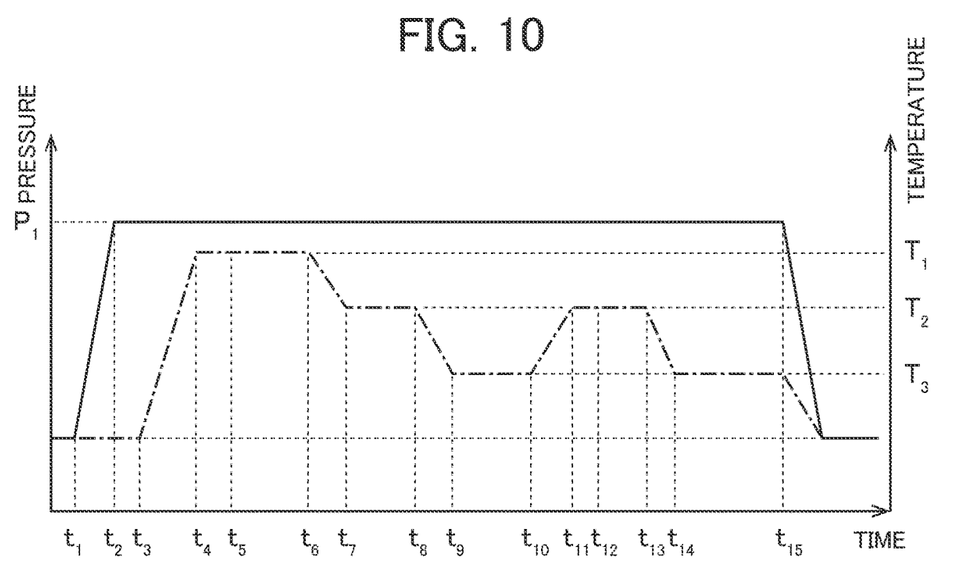
FIG. 10 is a timing chart showing the process steps for producing the quantum dot in the first embodiment.

FIG. 9 is a flowchart showing process steps for producing a quantum dot in the first embodiment. FIG. 10 is a timing chart showing process steps for producing the quantum dot in the first embodiment. The following more specifically describes the method of producing the quantum dot 21 on the basis of FIG. 9 and FIG. 10.

The first process step, i.e., Step S1, is supplying a liquid to the reactor of room temperature, as shown in FIG. 9. The liquid constitutes a medium by which a reaction for generating the quantum dot 21 is performed. An example of the liquid preferably used is a mixed solution of trioctylphosphine oxide and hexadecylamine.

The next process step, i.e., Step S2, is supplying an inert gas, such as argon gas, to the reactor of room temperature to replace the atmosphere within the reactor with the inert gas.

The next process step, i.e., Step S3, is pressurizing the reactor to pressure $P_1$ (about 10 to 100 MPa for instance), as shown in FIG. 9 and FIG. 10 (time $t_1$ to $t_2$), followed by keeping the pressure within the reactor at pressure $P_1$.

The next is raising the temperature within the reactor to temperature $T_1$ (about 300° C. for instance) in Step S4 (time $t_3$ to $t_4$), followed by keeping the temperature within the reactor at temperature $T_1$.

The next process step, i.e., Step S5, is supplying a raw material for forming the core 22 into the reactor (time $t_4$ to $t_5$). In Step S5, a mixture of diethylcadmium, selenium powder, and bis(trimethylsilyl) sulphide for instance can be supplied into the reactor as the raw material of the core 22.

The next process step, i.e., Step S6, is keeping the temperature within the reactor at temperature $T_1$ to perform a heat treatment (time $t_5$ to $t_6$).

The generation of the nucleus of the core 22 starts upon the start of supply of the raw material of the core 22 into the reactor in Step S5. The generation of the nucleus of the core 22 progresses mainly in Step S5 and Step S6.

The next is lowering the temperature within the reactor to temperature $T_2$ (about 200° C. for instance) in Step S7 (time $t_6$ to $t_7$), followed by Step S8, i.e., keeping the temperature within the reactor at temperature $T_2$ to perform a heat treatment (time $t_7$ to $t_8$). Step S8 includes growing the nucleus of the core 22 to form the core 22. Step S8 may include generating the nucleus of the core 22 parallel with the growth of the nucleus of the core 22.

The next is lowering the temperature within the reactor to temperature $T_3$ (about 100° C. for instance) in Step S9 (time $t_8$ to $t_9$), followed by Step S10, i.e., keeping the temperature within the reactor at temperature $T_3$ to perform a heat treatment (time $t_9$ to $t_{10}$). The low-temperature heat treatment in Step S10 can repair a deficit in the core 22 formed mainly in Step S8.

The next process step, i.e., Step S11, is raising the temperature within the reactor to temperature $T_2$ (time $t_{10}$ to $t_{11}$) and keeping the temperature within the reactor at temperature $T_2$.

The next process step, i.e., Step S12, is supplying a raw material for forming the shell 23 into the reactor (time $t_{11}$ to $t_{12}$). In Step S12, a mixture of diethylzinc, sulfur powder, and bis(trimethylsilyl) sulphide for instance can be supplied into the reactor as the raw material of the shell 23.

The next process step, i.e., Step S13, is keeping the temperature within the reactor at temperature $T_2$ to perform a heat treatment (time $t_{12}$ to $t_{13}$). The heat treatment in Step S13 can form the shell 23 onto the core 22.

The next process step, i.e., Step S14, is lowering the temperature within the reactor to temperature $T_3$ (time $t_{13}$ to $t_{14}$) and keeping the temperature within the reactor at temperature $T_3$.

The next process step, i.e., Step S15, is keeping the temperature within the reactor at temperature $T_3$ to perform a heat treatment (time $t_{14}$ to $t_{15}$). The low-temperature heat treatment in Step S15 can repair a deficit in the shell 23 formed mainly in Step S13.

The reactor then undergoes temperature lowering to room temperature to take the generated quantum dot 21 out of the reactor, and the production of the quantum dot 21 can be then completed.

The foregoing specific method of producing the quantum dot 21 is a mere example. The quantum dot 21 can be produced through a method, including a heating method, a hot injection method, a microwave assist method, and a continuous-flow method.

Another example preferred embodiments of the disclosure will be described. In the following description, components having functions common to those in the first embodiment will be denoted by common symbols, and their description will be omitted.

The first embodiment has described an instance where the reactor is kept under pressure during the whole period, i.e., from before the start of the generation of the nucleus of the core 22 (from before the supply of the raw material of the core 22) to the completion of the formation of the shell 23. The disclosure is not limited to this configuration.

Figure 11:
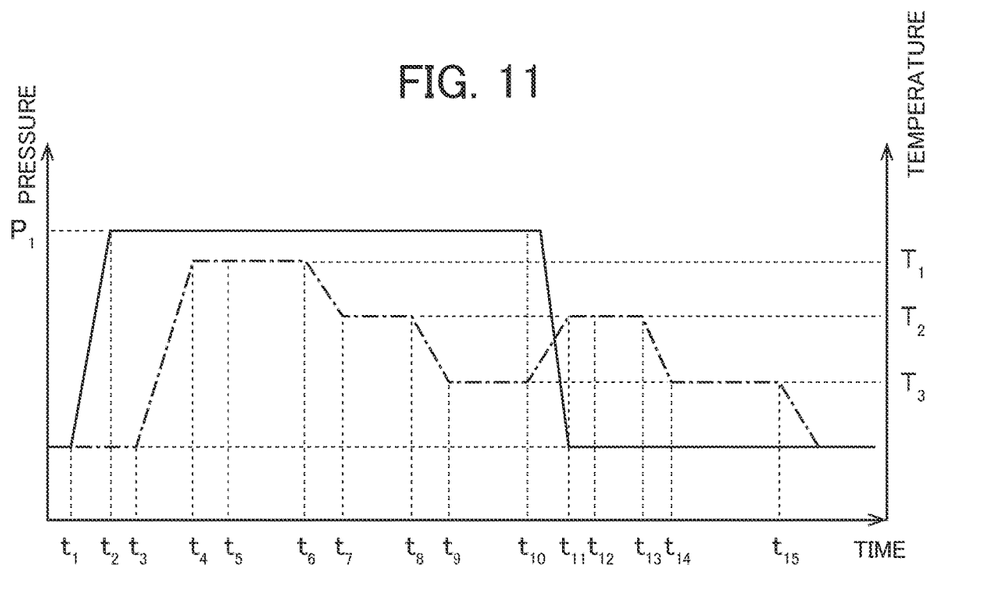
FIG. 11 is a timing chart showing process steps for producing a quantum dot in a second embodiment.

As illustrated in FIG. 11 for instance, the pressurization of the reactor may be started before the generation of the nucleus of the core 22 is started, and the reactor may be released from its pressurized state after the core 22 is formed and before the formation of the shell 23 is started (before the raw material of the shell 23 is supplied).

Figure 12:
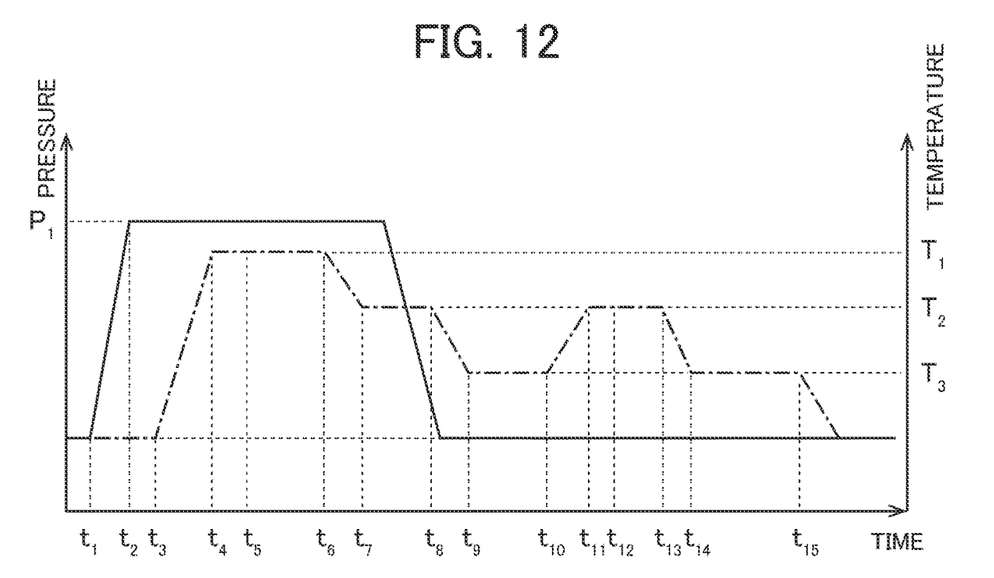
FIG. 12 is a timing chart showing process steps for producing a quantum dot in a third embodiment.

As illustrated in FIG. 12 for instance, the pressurization of the reactor may be started before the generation of the nucleus of the core 22 is started, and the reactor may be released from its pressurized state after the nucleus of the core 22 is generated.

Figure 13:
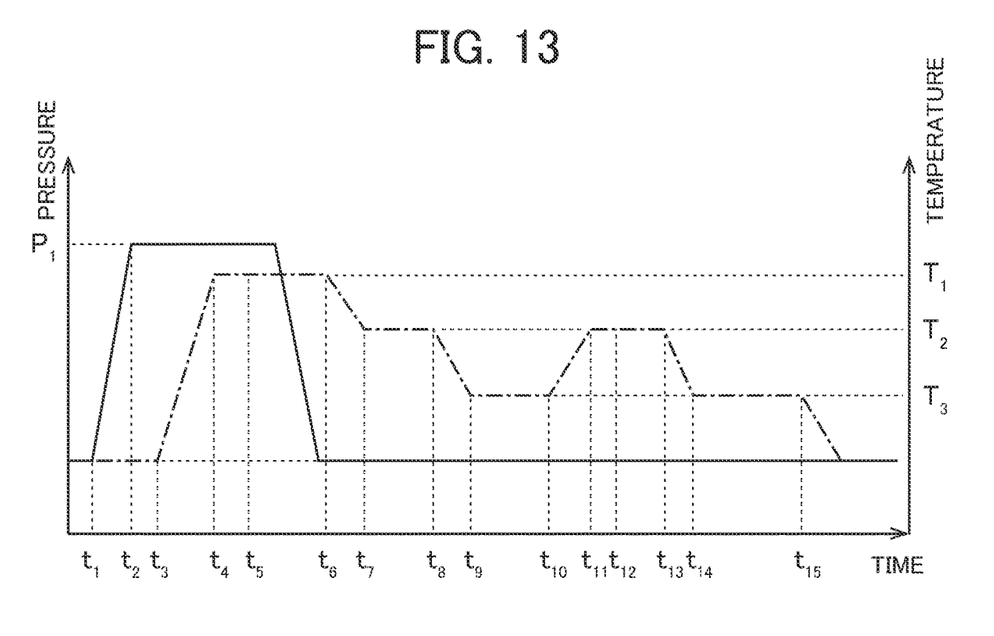
FIG. 13 is a timing chart showing process steps for producing a quantum dot in a fourth embodiment.

As illustrated in FIG. 13 for instance, the pressurization of the reactor may be started before the generation of the nucleus of the core 22 is started, and the reactor may be released from its pressurized state before the generation of the nucleus of the core 22 is completed.

The first embodiment has described that the light-emitting device 1 is an electroluminescence (EL) element, which emits light upon voltage application from the first electrode 11 and the second electrode 12. How an element emits light is non-limiting in the disclosure.

The light-emitting device according to the disclosure may be a photoluminescence (PL) element for instance, which includes quantum dots that emit light upon light irradiation. The light-emitting device in this case may further include a light source that irradiates a light-emitting layer containing quantum dots with excited light of the quantum dots. The light source may be a light-emitting diode (LED) for instance, such as an organic light-emitting diode (OLED).

The first embodiment has described an instance where the light-emitting device 1 has a single light-emitting layer 20. The disclosure is not limited to this configuration. The light-emitting device according to the disclosure may have a plurality of stacked light-emitting layers 20. The plurality of light-emitting layers 20 in this case may contain mutually different kinds of quantum dots or have mutually different particle diameters of the quantum dots.

The light-emitting device according to the disclosure may constitute, but not limited to, a display device and an illumination device.

The light-emitting device according to the disclosure may constitute, for instance, a display device with a plurality of kinds of light-emitting devices that emit mutually different colors of light arranged in matrix. The plurality of kinds of light-emitting devices in this case may include a light-emitting device that emits red (R) light, a light-emitting device that emits green (G) light, and a light-emitting device that emits blue (B) light.

The invention claimed is:

1. A light-emitting device comprising:
    a light-emitting part containing a quantum dot having a core and a shell located outside the core,
    wherein each of the core and the shell has a hexagonal structure,
    a lattice constant of the core is larger than a lattice constant of the shell,
    the core has a plurality of crystal planes different from each other in surface free energy,
    the plurality of crystal planes includes a first crystal plane and a second crystal plane having higher surface free energy than the first crystal plane, and
    the shell located on the second crystal plane includes a portion thicker than the shell located on the first crystal plane.

2. The light-emitting device according to claim 1, wherein the first crystal plane is at least one of a (0-110) plane, a (1-100) plane, a (10-10) plane, a (01-10) plane, a (-1100) plane, and a (-1010) plane, and
    the second crystal plane is at least one of a (2-1-10) plane, a (1-210) plane, a (11-20) plane, a (-2110) plane, a (-12-10) plane, and a (-1-120) plane.

3. The light-emitting device according to claim 1, wherein the core has a crystal plane having higher surface free energy than a crystal plane of the shell.

4. The light-emitting device according to claim 1, wherein an area ratio of a (2-1-10) plane, a (1-210) plane, a (11-20) plane, a (-2110) plane, a (-12-10) plane, and a (-1-120) plane to a crystal plane of the core is higher than an area ratio of a (2-1-10) plane, a (1-210) plane, a (11-20) plane, a (-2110) plane, a (-12-10) plane, and a (-1-120) plane to a crystal plane of the shell.

5. The light-emitting device according to claim 1, wherein the quantum dot has a hexagonal-prism shaped outline.

6. The light-emitting device according to claim 1, wherein each of the core and the shell individually contains at least one of a group II-VI semiconductor and a group III-V semiconductor.

7. The light-emitting device according to claim 6, wherein
in the group II-VI semiconductor, group VI elements are fewer than group II elements in a stoichiometric ratio, and
in the group III-V semiconductor, group V elements are fewer than group III elements in a stoichiometric ratio.

8. A method for manufacturing a light-emitting device that includes a light-emitting part containing a quantum dot having a core and a shell located outside the core, the method comprising:
a nucleus generation step of supplying a raw material of the core to a reactor to generate a nucleus of the core;
a core formation step of growing the nucleus of the core to form the core; and
a shell formation step of supplying a raw material of the shell to the reactor to form the shell having a lattice constant smaller than a lattice constant of the core,
wherein the nucleus generation step is started with the reactor under pressure,
the core has a plurality of crystal planes different from each other in surface free energy,
the plurality of crystal planes includes a first crystal plane and a second crystal plane having higher surface free energy than the first crystal plane, and
the shell located on the second crystal plane includes a portion thicker than the shell located on the first crystal plane.

9. The method according to claim 8, wherein the core formation step is started with the reactor under pressure.

10. The method according to claim 8, wherein the nucleus generation step and the core formation step are performed with the reactor under pressure.

11. The method according to claim 8, wherein the nucleus generation step, the core formation step, and the shell formation step are performed with the reactor under pressure.

12. A light-emitting device comprising:
a light-emitting part containing a quantum dot having a core and a shell located outside the core,
wherein each of the core and the shell has a hexagonal structure,
a lattice constant of the core is larger than a lattice constant of the shell, and
an area ratio of a (2-1-10) plane, a (1-210) plane, a (11-20) plane, a (-2110) plane, a (-12-10) plane, and a (-1-120) plane to a crystal plane of the core is higher than an area ratio of a (2-1-10) plane, a (1-210) plane, a (11-20) plane, a (-2110) plane, a (-12-10) plane, and a (-1-120) plane to a crystal plane of the shell.

13. The light-emitting device according to claim 12, wherein the core has a plurality of crystal planes different from each other in surface free energy.

14. The light-emitting device according to claim 12, wherein
the first crystal plane is at least one of a (0-110) plane, a (1-100) plane, a (10-10) plane, a (01-10) plane, a (-1100) plane, and a (-1010) plane, and
the second crystal plane is at least one of a (2-1-10) plane, a (1-210) plane, a (11-20) plane, a (-2110) plane, a (-12-10) plane, and a (-1-120) plane.

15. The light-emitting device according to claim 12, wherein the core has a crystal plane having higher surface free energy than a crystal plane of the shell.

16. The light-emitting device according to claim 12, wherein the quantum dot has a hexagonal-prism shaped outline.

17. The light-emitting device according to claim 12, wherein each of the core and the shell individually contains at least one of a group II-VI semiconductor and a group III-V semiconductor.

18. The light-emitting device according to claim 17, wherein
in the group II-VI semiconductor, group VI elements are fewer than group II elements in a stoichiometric ratio, and
in the group III-V semiconductor, group V elements are fewer than group III elements in a stoichiometric ratio.

* * * * *